United States Patent
Oomori

(10) Patent No.: US 7,023,889 B2
(45) Date of Patent: Apr. 4, 2006

(54) LASER MODULE

(75) Inventor: Hirotaka Oomori, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 276 days.

(21) Appl. No.: 10/428,160

(22) Filed: May 2, 2003

(65) Prior Publication Data
US 2003/0227950 A1 Dec. 11, 2003

(30) Foreign Application Priority Data
May 2, 2002 (JP) ............................. P2002-130770

(51) Int. Cl.
*H01S 3/00* (2006.01)
(52) U.S. Cl. .................. 372/38.02; 372/50.1
(58) Field of Classification Search .................. 372/34, 372/36, 38.02, 29.016, 25, 50.1; 257/712; 438/122
See application file for complete search history.

(56) References Cited
U.S. PATENT DOCUMENTS

| | | | |
|---|---|---|---|
| 4,811,166 A * | 3/1989 | Alvarez et al. ............. | 361/717 |
| 5,638,391 A * | 6/1997 | Shima et al. ........... | 372/44.011 |
| 5,640,188 A * | 6/1997 | Andrews ..................... | 347/130 |
| 6,084,895 A | 7/2000 | Kouchi et al. | |
| 6,116,792 A | 9/2000 | Kosugi | |
| 6,456,635 B1 * | 9/2002 | Shiomoto et al. ............. | 372/36 |
| 2004/0062285 A1 * | 4/2004 | Uchizaki et al. .............. | 372/50 |

FOREIGN PATENT DOCUMENTS

| | | | |
|---|---|---|---|
| JP | 03-254231 | * | 11/1991 |
| JP | 03-254232 | * | 11/1991 |

* cited by examiner

*Primary Examiner*—Minsun Harvey
*Assistant Examiner*—Tuan N. Nguyen
(74) *Attorney, Agent, or Firm*—McDermott Will & Emery LLP

(57) ABSTRACT

A laser module has two semiconductor laser devices and a laser driving circuit. These laser devices are placed adjacent to each other. The laser driving circuit has normal and reverse phase data output terminals. One semiconductor laser device is connected to the normal phase data output terminal, and the other semiconductor laser device is connected to the reverse phase data output terminal. When a series of identical bits is output, the temperature changes of the two laser devices are complementary. Accordingly, the temperature variation of each laser device is moderated. Thus, the variation in the amount of chirp can be reduced.

7 Claims, 7 Drawing Sheets

LASER MODULE

BACKGROUND OF THE INVENTION

1. Field of the Invention

The present invention relates to a laser module having a semiconductor laser device.

2. Related Background Art

FIG. 6 is a schematic view showing the configuration of a conventional laser module 2. The laser module 2 has a laser diode (hereinafter, referred to as "LD") therein. In general, an operating current is provided from an LD driver 14 into an LD chip 11 through a wire 21. In a laser module for optical communications, the operating current is modulated for transmitting data. The LD chip 11 generates laser light 15 through electric-optic conversion of the operating current. The laser light 15 is focused by a lens 20 and emitted from the laser module 2.

Electric-optic conversion takes place in the vicinity of the contact point (junction portion) 11a between the wire 21 and the LD chip 11. Accordingly, the output wavelength of the LD chip 11 is largely influenced by the temperature of the junction portion 11a. For example, the output wavelength deviates by 1 pico-meter in response to the temperature change of 0.01° C.

In order to monitor the temperature of the LD chip 11, a thermistor 16 is placed in the vicinity of the LD chip 11, a thermistor 16 is placed in the vicinity of the LD chip 11. The thermistor 16 and the LD chip 11 are mounted on a chip carrier 18. The thermistor 16 can monitor the temperature of the surface of the LD chip 11, but cannot directly monitor the temperature at the junction portion 11a. Therefore, it is difficult to completely control the output wave length of the LD based on the temperature measured by the thermistor 16.

Further, in an optical network using the conventional laser module, it is difficult to transmit data over a long distance. This is because chirp in the signal light varies while the identical bits are output continuously.

FIG. 7 shows the result of measuring chirp regarding the conventional laser module. The line represented by "Power" indicates the output power of the LD, and the line represented by "Chirp" indicates the amount of chirp in the output light from the LD. While the power is at a high level, a bit with a value of "1" is output. On the other hand, while the power is at a low level, a bit with a value of "0" is output. The chirp shown in FIG. 7 is a numeric value obtained by converting the amount of wavelength chirp into a frequency.

As shown in FIG. 7, while bits "1" are output continuously, the chirp gradually decreases. When the chirp varies while a series of bits "1" is output, the wavelength of the signal light is shifted, for example, between the first bit "1" and the last bit "1". This wavelength shift causes waveform distortion of the signal light due to wavelength dispersion in an optical communication line. The distortion becomes more significant with increasing the transmission distance. Accordingly, it is difficult to transmit data including a series of identical bits over a long distance. The identical bits are likely to continue for a long bit length when the number of the stages of a pseudo random bit sequence (PRBS) is large.

SUMMARY OF THE INVENTION

It is an object of the present invention to reduce the variation in chirp when a laser module outputs the identical bits continuously.

A laser module of the present invention emits laser signal light. The laser module includes first and second semiconductor laser devices, a laser driving circuit, and an optical system. The first and second semiconductor laser devices are placed adjacent to each other. The laser driving circuit has a first output terminal for a normal phase data and a second output terminal for a reverse phase data. The optical system guides laser light generated in the first laser device to the outside of the laser module. The first laser device is connected to one of the first and second output terminals. The second laser device is connected to the other of the first and second output terminals. The first and second laser devices may be jointed together by interposing thermal conductive material therebetween.

A signal supplied to the second laser device from the laser driving circuit is a signal inverted with respect to a signal supplied to the first laser device from the laser driving circuit. Accordingly, the first and second laser devices have complementary temperature changes. Thus, the temperature variation of the first laser device when there is a series of identical bits is moderated. Correspondingly, the variation of chirp of the output light from the laser module is reduced when there is a series of identical bits. Therefore, data can be transmitted over a long distance when the laser module is used as a signal light source in an optical network.

Another aspect of the present invention provides a laser module including a semiconductor laser device, a laser driving circuit, and an optical system. The laser driving circuit has a first output terminal for a normal phase data and a second output terminal for a reverse phase data. The optical system guides laser light generated in the semiconductor laser device to the outside of the laser module. The semiconductor laser device has first and second active layers, and first and second electrodes. The first and second active layers extend in parallel to each other. The first electrode is connected to one of the first and second output terminals. The first electrode provides a current from the laser driving circuit into the first active layer. The second electrode is connected to the other of the first and second output terminals. The second electrode provides a current from the laser driving circuit into the second active layer. The optical system guides laser light generated in the first active layer to the outside of the laser module.

A signal supplied to the second active layer from the laser driving circuit is a signal inverted with respect to a signal supplied to the first active layer from the laser driving circuit. Accordingly, the first and second active layers have complementary temperature changes. Thus, the temperature variation of the first active layer when there is a series of identical bits is moderated. Correspondingly, the variation of chirp of the output light of the laser module is reduced when there is a series of identical bits. Therefore, data can be transmitted over a long distance when the laser module is used as a signal light source in an optical network.

A further aspect of the present invention provides an optical network. The optical network includes at least one of the above laser modules. In this optical network, light emitted from the laser module is used as communication light. Therefore, data including a series of identical bits can be transmitted over a long distance in this optical network.

Further scope of applicability of the present invention will become apparent from the detailed description given hereinafter. However, it should be understood that the detailed description and specific examples, while indicating preferred embodiments of the invention, are given by way of illustration only, since various changes and modifications in the spirit and scope of the invention will become apparent to those skilled in the art from this detailed description.

DESCRIPTION OF THE PREFERRED EMBODIMENTS

Figure 1:
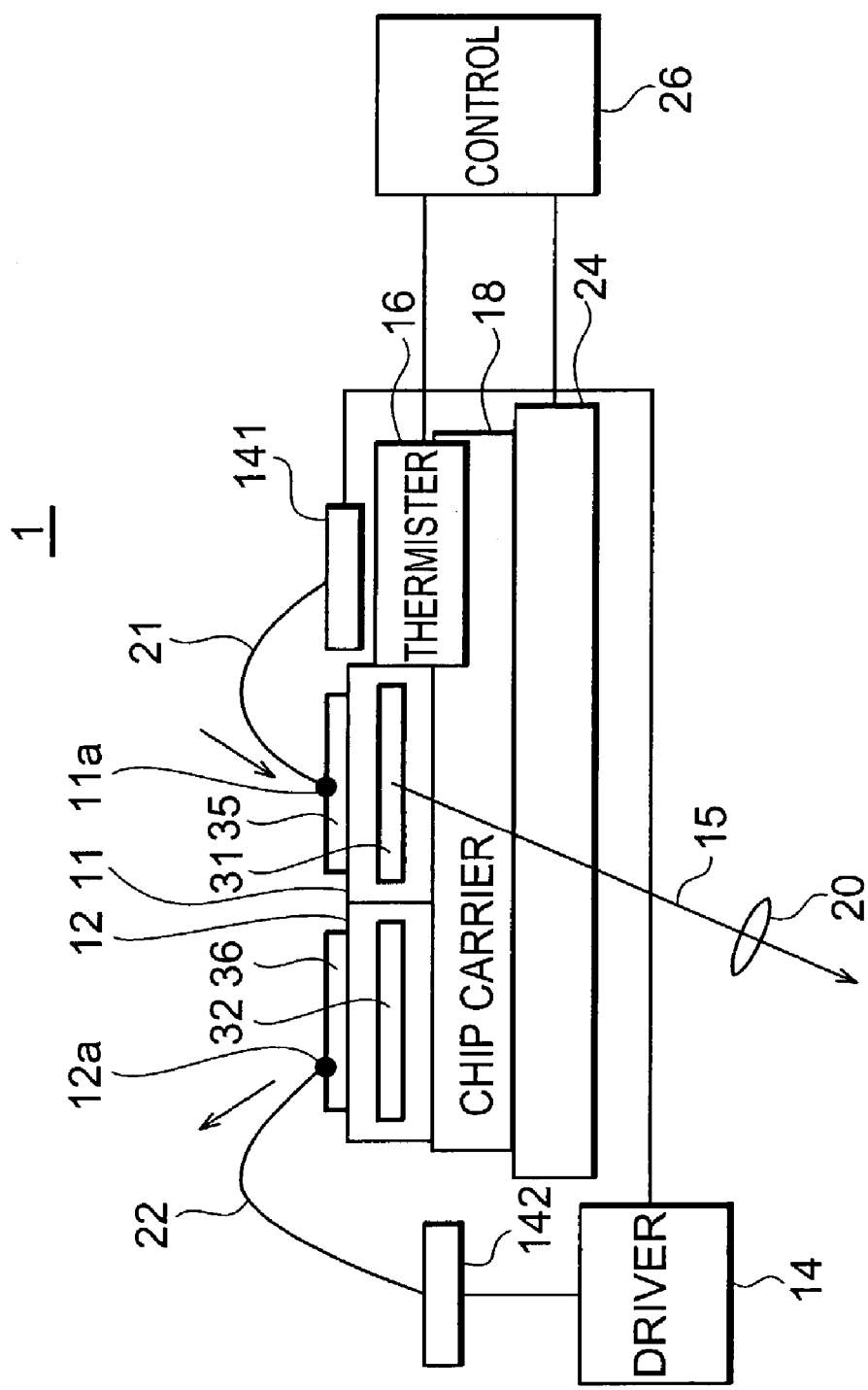
FIG. 1 is a schematic view showing the constitution of a laser module of a first embodiment.

The preferred embodiments of the present invention will be described below in greater detail with reference to the accompanying drawings. To facilitate understanding, identical reference numerals have been used, where possible, to designate identical or equivalent elements that are common to the figures without repeating the overlapping descriptions.

First Embodiment

Figure 5A:
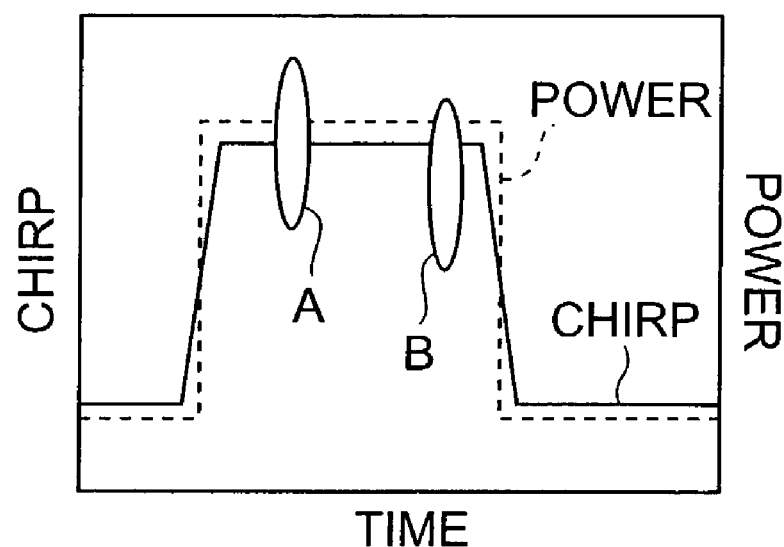
FIG. 5A shows ideal chirp in a laser module.
Figure 5B:
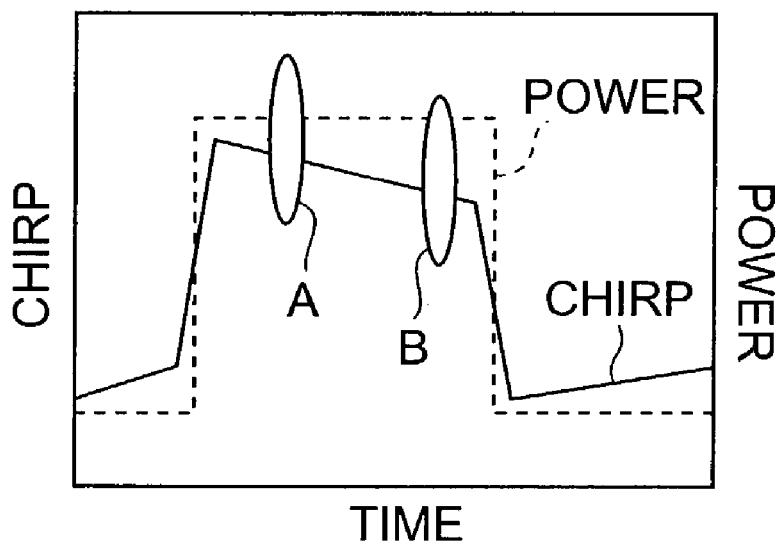
FIG. 5B shows actual chirp in the prior art laser module.
Figure 6:
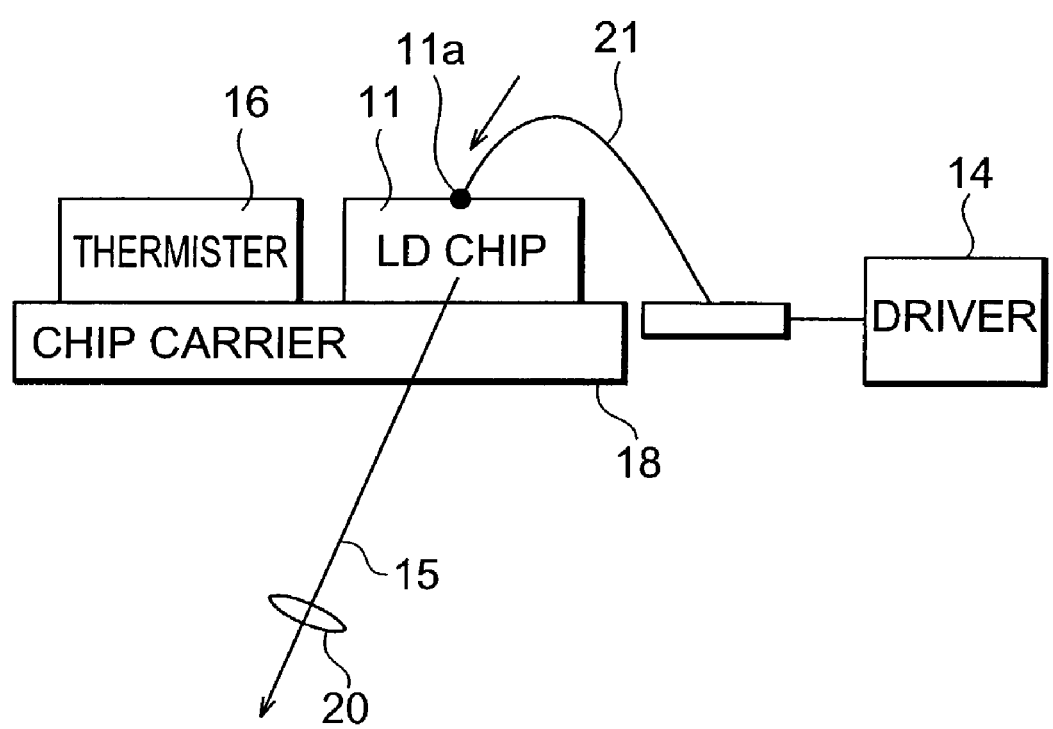
FIG. 6 is a schematic view showing the constitution of the conventional laser module.

Before concretely explaining the present embodiment, the present embodiment will be outlined. As described above, in the conventional laser module (FIG. 6), the amount of chirp varies while the identical bits are output continuously. Referring to FIGS. 5A and 5B, the variation of chirp will be described in detail. FIG. 5A shows an ideal variation of chirp over time, and FIG. 5B shows an actual variation of chirp over time in the conventional laser module. In both figures, a broken line indicates the output power of a laser diode (hereinafter, referred to as "LD"), and a solid line indicates the amount of chirp in the output light. While the power is at a high level, a bit "1" is output. On the other hand, while the power is at a low level, a bit "0" is output.

In FIGS. 5A and 5B, both data areas A and B have only bits "1". Therefore, ideally, as shown in FIG. 5A, the amounts of chirp are at the same level between the first bit 1 (the area A in FIG. 5A) and the last bit "1" (the area B is FIG. 5B.) As a result, even after data is transmitted fiber, the difference of the arrival between the first and the last bits "1" should be virtually at the same degree as that before the transmission.

Figure 7:
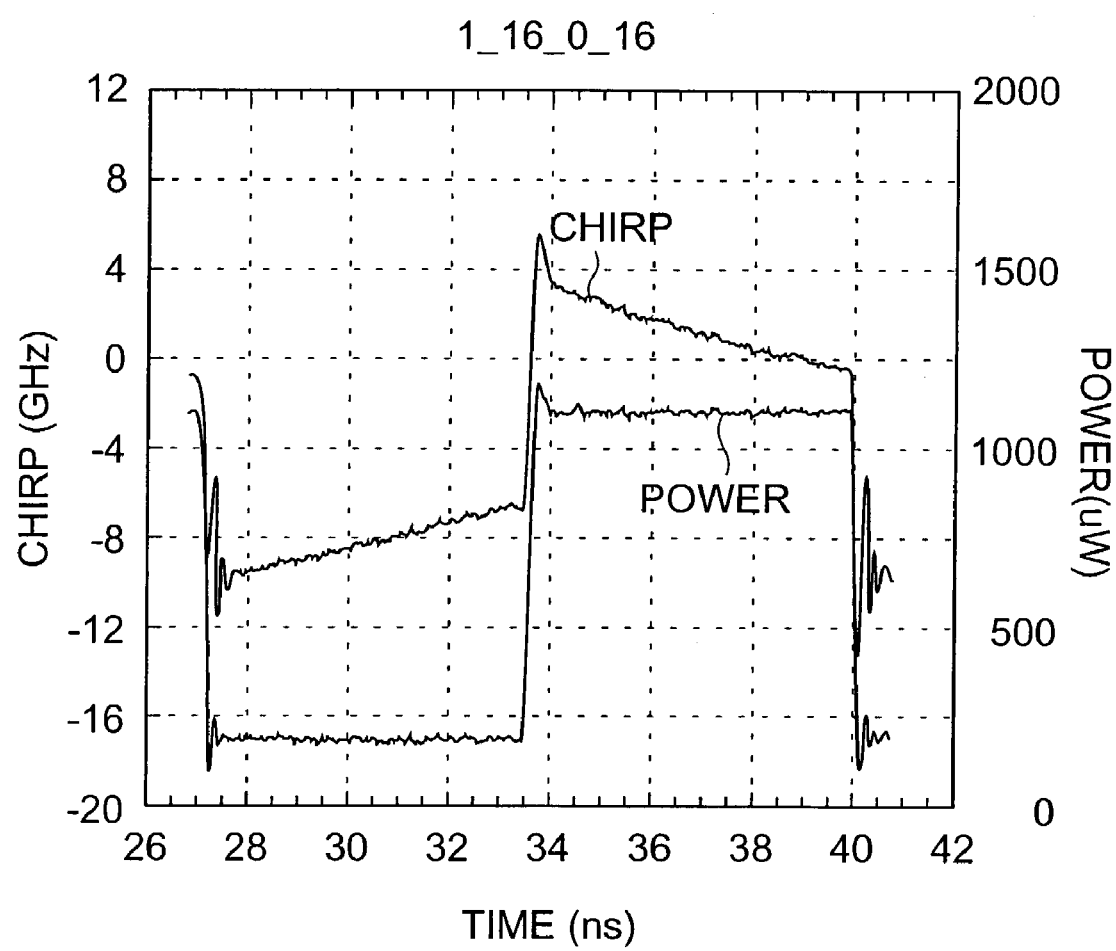
FIG. 7 shows the amount of chirp measured regarding the conventional laser module.

However, actually, as shown in FIG. 5B, the amounts of chirp are slightly different between the first and last bits "1". In FIG. 7 showing actual data, such a behavior appears. An optical fiber used as an optical communication line has wavelength dispersion. Accordingly, when signal light with different wavelengths is simultaneously sent, the arrival times to a receiver for respective signal light are different depending on the transmission distance. Therefore, the time difference between the first and last bits "1" differs between before and after transmission. This induces distortion in the waveform of the output signal light. As the amount of distortion increases (in other words, the difference of a chirp between the areas A and B increases), accurate data communications become more difficult. Accordingly, reducing the variation in the amount of chirp when there is a series of identical bits is an important subject.

The cause of the variation of chirp when the identical bits are output will now be described. When a series of bits "1" is output, a current at a relatively high level is continuously supplied to the LD. This raises the temperature at the contact point (junction portion) between the LD and a wire. As a result, the amount of chirp varies temperature at the contact point (junction portion) between the LD and a wire. As a result, the amount of chirp varies while bits "1" are output continuously. When a bit "0" is output after a series of bits "1", the temperature of the junction portion remains at a high level. Therefore, light with a wavelength, which is different from the wavelength that the light should have at the time of outputting a bit "0", is output for the bit "0". When a series of bits "0" is output after a series of bits "1", the temperature of the junction portion gradually decreases. In response to the temperature decrease, the amount of chirp varies over time.

If the thermal conductivity of the LD is sufficiently high, the heat generated at the junction portion can be dissipated outside. However, the heat dissipation is difficult in practice. Since the temperature at the surface of the LD increases as the temperature of the junction portion increases, a measure of adjusting the LD temperature with temperature measurement using a thermistor may be conceived. Certainly, if the temperature at the surface of the LD changes sufficiently later than the temperature change at the junction portion, the variation of chirp could be reduced by adjusting the LD temperature using a temperature regulator. However, even if a hundred of bits "1" are output at a data rate of 155 Mbps, the time delay of the temperature change at the surface of the LD is 1 μs or less. This is shorter than the response time of a temperature control. Therefore, it is difficult to reduce the variation of chirp by adjusting the temperature of the LD.

According to the present invention, the temperature variation at the junction portions can be reduced by placing two LDs in parallel and adjacent to each other. These LDs have the substantially identical configurations. One LD is for signal outputting, and the other LD is for temperature adjustment of the signal outputting LD. An output terminal for a normal phase data of a laser driving circuit is connected to one LD, and an output terminal for a reverse phase data of the laser driving circuit is connected to the other LD. Thus, the signal outputting LD and the temperature adjusting LD generate opposite bits. In other words, when one LD generates a bit "1", the other LD generates a bit "0".

Accordingly, the junction portions of these LDs show opposite temperature changes, thereby moderating the temperature variations at the junction portions when there is a series of identical bits are inputted.

Figure 2:
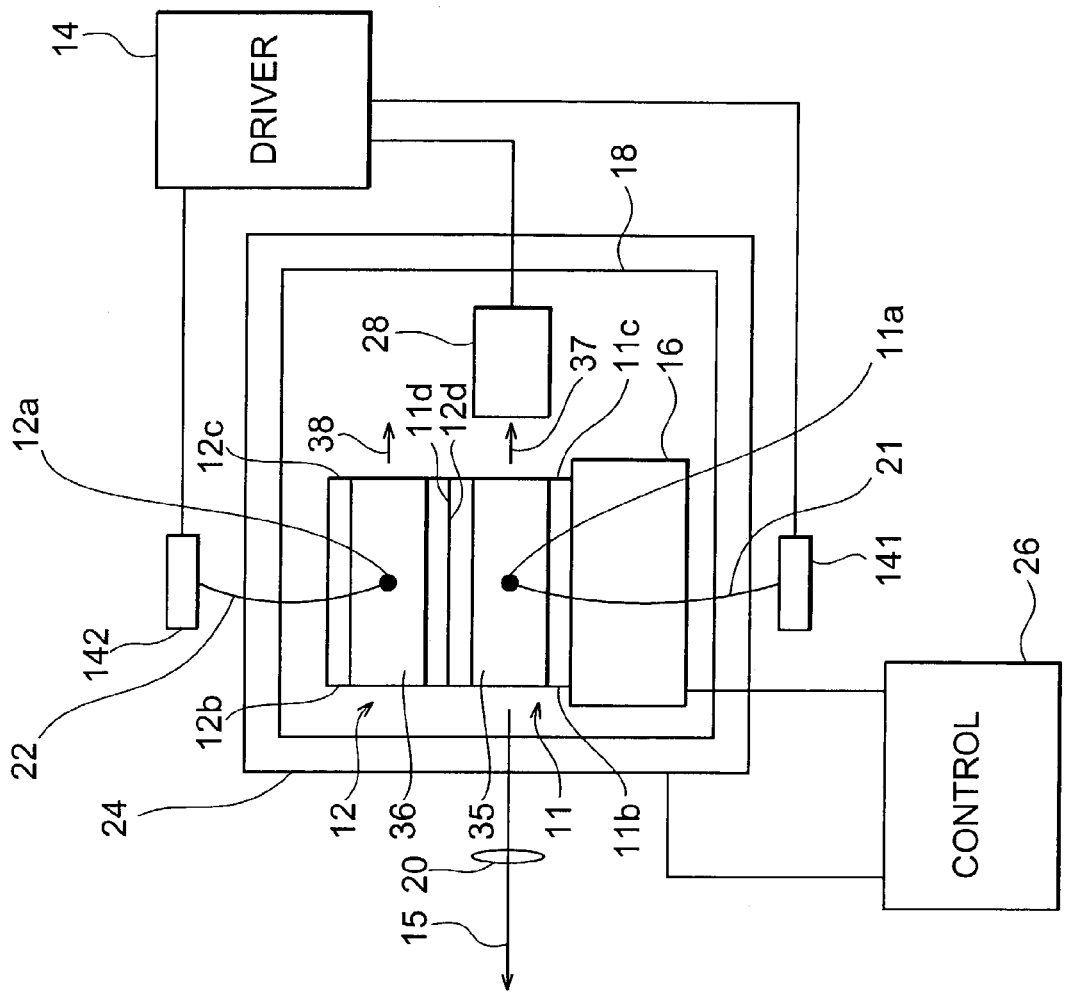
FIG. 2 is a schematic plan view showing the constitution of the laser module of the first embodiment.

Referring to FIGS. 1 and 2, the present embodiment will now be described in detail. FIG. 1 is a schematic view showing the constitution of a laser module 1 of the first embodiment. FIG. 2 is a schematic plan view showing the laser module 1. The laser module 1 has LD chips 11 and 12, an LD driver 14, a thermistor 16, and a temperature controller circuit 26. The LD devices 11 and 12 and the thermistor 16 are mounted on a chip carrier 18. The laser module 1 further includes a lens 20. These components are contained in a housing (that is not shown in the figures).

Both the LD chips 11 and 12 are semiconductor laser devices. These are the substantially identical devices, and therefore have the substantially identical compositions and structures. The LD chip 11 has an active layer 31 and an electrode 35 provided on the top surface of the LD chip 11 above the active layer 31. The LD chip 12 has an active layer 32 and an electrode 36 provided on the top surface of the LD chip 12 above the active layer 32. The LD chips 11 and 12 are placed on the chip carrier 18 in parallel and adjacent to each other. When operating currents are provided into the LD chips 11 and 12 through the electrodes 35 and 36, the LD chips 11 and 12 generate laser light according to the operating currents. As described later, the output light of the laser module 1 is taken out from the LD chip 11.

As shown in FIG. 2, the LD chip 11 has a light-transmitting front surface 11b and a light-reflective rear surface 11c. The laser light 15 generated in the active layer 31 passes through the front surface 11b and propagates from the LD chip 11. The LD chip 12 has a light-transmitting front surface 12b and a light-reflective rear surface 12c. The LD chip 12 is provided in order to adjust the temperature of the LD chip 11. The LD chips 11 and 12 are jointed together with the side surfaces 11d and 12d of the LD chips abutting to each other. Thermal conductive material may be interposed between the joint surfaces 11d and 12d.

The LD driver 14 is a laser controller circuit for supplying the operating currents to the LD chips 11 and 12. These operating currents are signal currents modulated according to the data to be output. The LD driver 14 has normal and reverse phase output terminals 141 and 142. At the output terminal 142 for the reverse phase data, a signal obtained by inverting the signal at the output terminal 141 for the normal phase data is generated. The output terminal 141 for the normal phase data is electrically connected to the LD chip 11 through a wire 21. One end of the wire 21 is wire-bonded to the output terminal 141 for the normal phase data, and the other end thereof is jointed to the electrode 35 on the top surface of the LD chip 11. In the figures, the junction portion between the LD chip 11 and the wire 21 is denoted by the reference numeral 11a. The reverse phase output terminal 142 is electrically connected to the LD chip 12 through a wire 22. One end of the wire 22 is wire-bonded to the output terminal 142 for the reverse phase data, and the other end thereof is wire-bonded to the electrode 36 on the top surface of the LD chip 12. The junction portion between the LD chip 12 and the wire 22 is denoted by the reference numeral 12a.

The currents provided from the LD driver 14 into the LD chips 11 and 12 have the magnitudes (current levels) according to the bit of the data. The LD driver 14 provides higher level currents into the LD chips 11 and 12 in response to a bit "1", and provides lower level currents into the LD chips 11 and 12 in response to a bit "0". Accordingly, the amounts of heat generation at the junction portions 11a and 12a of the LD chips 11 and 12 are large when signal light of a bit "1" is output, and small when signal light of a bit "0" is output.

The thermistor 16 is a temperature measuring device for measuring the temperature of the LD chip 11 for the signal output. The thermistor 16 is placed on the chip carrier 18 in the vicinity of the LD chip 11. The thermistor 16 is thermally coupled to the LD chip 11 through the surface of the chip carrier 18. The thermistor 16 is electrically connected to the temperature controller circuit 26. The thermistor 16 sends an output signal to the temperature controller circuit 26 according to a measured temperature.

In order to cool the LD chips 11 and 12, a temperature regulator 24, such as a Peltier element, may be disposed in the laser module 1. The temperature regulator 24 is placed so as to be thermally coupled to the LD chips 11 and 12. For example, the temperature regulator 24 could be disposed under the chip carrier 18. The temperature regulator 24 is electrically connected to the temperature controller circuit 26. The temperature controller circuit 26 drives the temperature regulator 24 in accordance with the output of the thermistor 16. The temperature of the LD chips 11 and 12 is adjusted in this way.

The lens 20 is an optical system for guiding laser light from the LD chip 11 to the outside of the laser module 1. The lens 20 focuses the laser light 15 propagating from the front surface 11b of the LD chip 11. After passing through the lens 20, the laser light 15 is emitted to the outside of the laser module 1. The lens 20 does not guide laser light from the LD chip 12 to the outside of the laser module 1. As a result, the laser module 1 outputs only the laser light generated in the LD chip 11. The lens 20 may be a single lens or a compound lens.

In order to monitor the output light of the LD chip 11, a photodetector 28, such as a photodiode, maybe disposed in the laser module 1. The photodetector 28 measures the power of the laser light generated in the LD chip 11. The photodetector 28 can be placed so as to face to the rear surface 11c of the LD chip 11. In this case, the photodetector 28 detects the laser light 37 leaking from the rear surface 11c. The photodetector 28 is disposed so as not to receive the laser light 38 leaking from the rear surface 12c of the LD chip 12. The photodetector 28 may be electrically connected to the LD driver 14. In this case, the LD driver 14 can adjust the magnitude of the operating current in accordance with the power of the output light of the LD chip 11 indicated by the output of the photodetector 28.

The operations of the laser module 1 will now be described. When the laser module 1 outputs the signal light, the LD driver 14 provides operating currents into the LD chips 11 and 12. As described above, the LD chip 11 is connected to the output terminal 141 for the normal phase data, and the LD chip 12 is connected to the output terminal 142 for the reverse phase data. Accordingly, the inverse data of the input data to the LD chip 11 is input into the LD chip 12.

The magnitudes of the operating currents are different between a bit "1" and a bit "0". Accordingly, when there is a series of identical bits, a temperature gradient is generated between the junction portions 11a and 12a. When a bit "1" is input into the LD chip 11, a bit "0" is input into the LD chip 12. Therefore, the heat generated at the junction portion 11a of the LD chip 11 can be diffused toward the LD chip 12. On the other hand, when a bit "0" is input into the LD chip 11, a bit "1" is input into the LD chip 12. At this time, the heat flows from the LD chip 12 into the LD chip 11. Therefore, the decrease of the temperature at the junction portion 11a is suppressed when a series of bits "0" is input into the LD chip 11 after a series of bits "1" is input.

Thus, the junction portions 11a and 12a have the complementary temperature changes, and it reduces the temperature variation at the junction portion 11a when there is a series of identical bits. Accordingly, the variation of chirp over time can be reduced when there is a series of identical bits. Therefore, if the laser module 1 is used as a light source of signal light in an optical network, data can be transmitted over a long distance.

Instead of the temperature adjusting LD 12, a heat sink may be directly attached to the side of the signal outputting LD 11. Since the heat dissipation property of the junction portion 11a is improved in such configuration, the variation of chirp over time can be reduced. However, unlike the present embodiment, the temperature adjustment using a heat sink is not complementary. Accordingly, the variation of chirp still remains, and it is not as effective as in the present embodiment.

The variation of chirp can also be reduced by enlarging the electrode of the junction portion 11a, instead of using the temperature adjusting LD 12. However, when the electrode is large, there is a disadvantage that the parasitic capacitance of the LD 11 increases. This method is effective for low speed application where parasitic capacitance is not regarded.

A method of reversely mounting the LD chip 11 on the chip carrier 18 so that the junction portion 11a is in contact with the chip carrier 18 may be applied. In this case, if the temperature of the LD chip 11 is controlled based on the temperature measurement using the thermistor 16, the variation of chirp can be reduced. However, such mounting is difficult process.

In the present embodiment, the variation of chirp can be reduced only by placing two identical LDs adjacent to each other. Therefore, the manufacture of the laser modules is easier than using the above-described methods.

Second Embodiment

Figure 3:
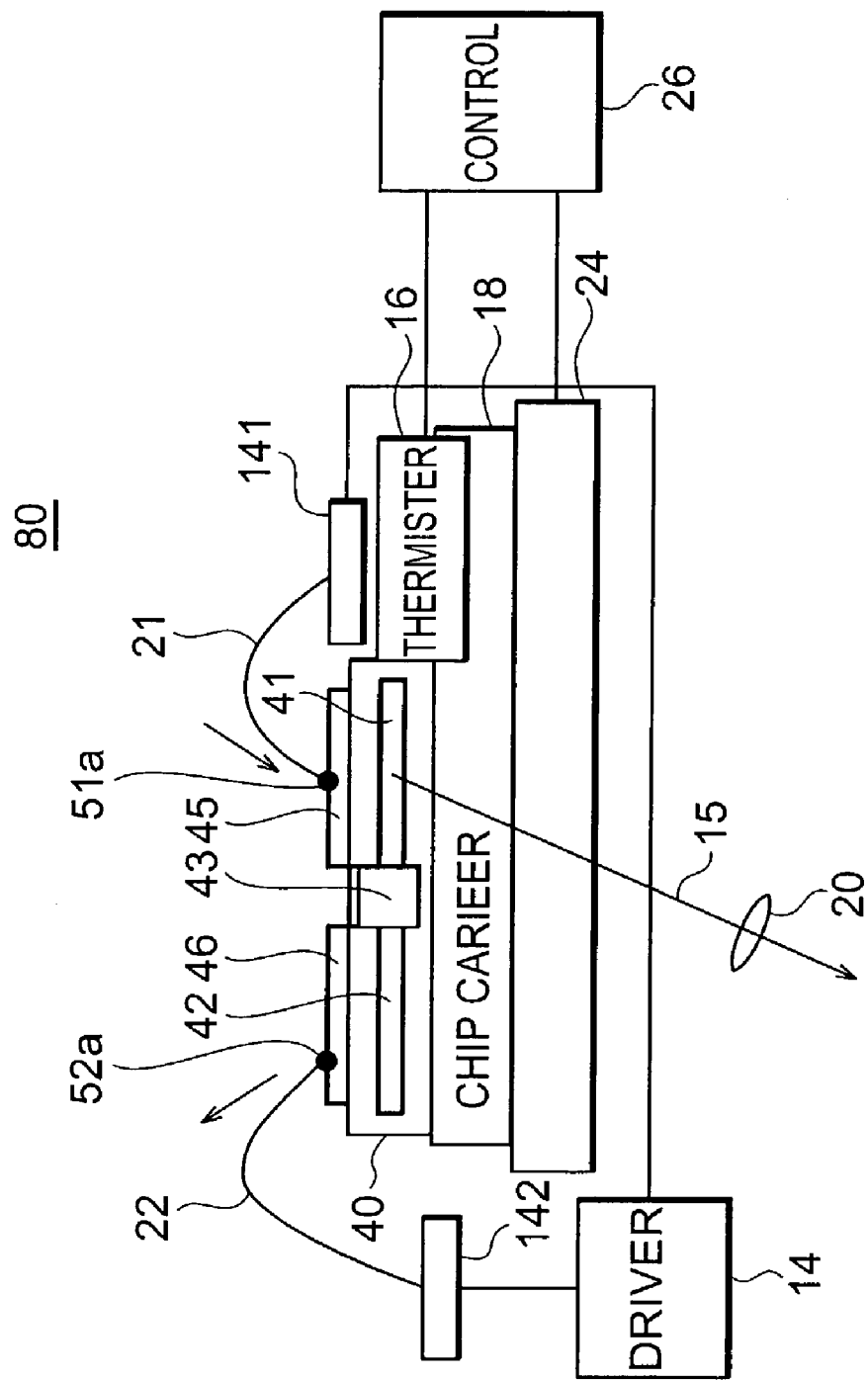
FIG. 3 is a schematic view showing the constitution of a laser module of a second embodiment.
Figure 4:
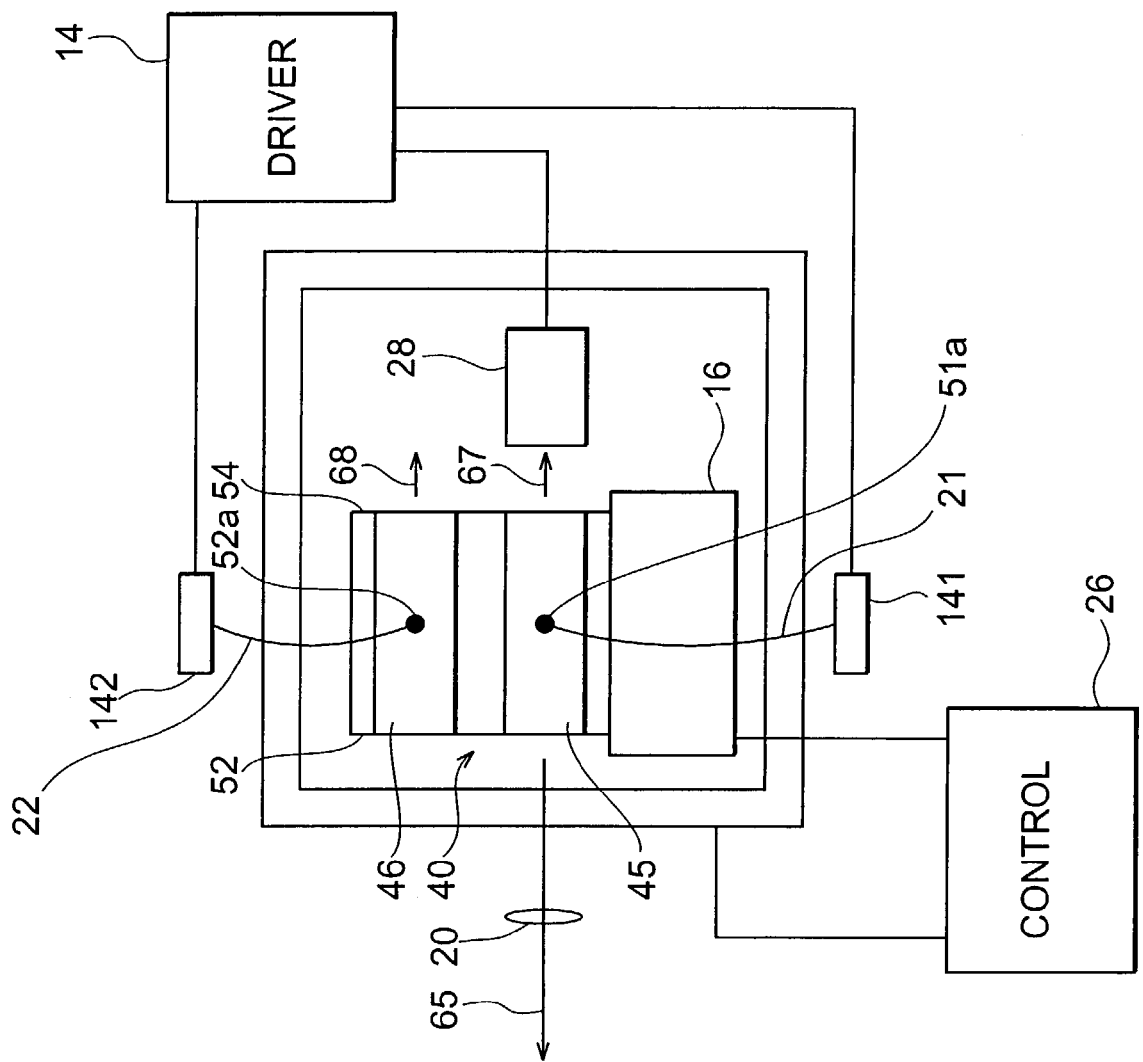
FIG. 4 is a schematic plan view showing the constitution of the laser module of the second embodiment.

FIG. 3 is a schematic view showing the configuration of a laser module 80 of a second embodiment. FIG. 4 is a schematic plan view showing the laser module 80. As described above, the two semiconductor laser devices 11 and 12 are disposed side by side in the first embodiment. Instead of these laser devices, a single semiconductor laser device 40 with two active layers 41 and 42 is disposed in the laser module 80 of the present embodiment. These active layers 41 and 42 have the substantially identical configurations, and therefore have the substantially identical compositions and structures. The first and second active layers 41 and 42 extend in parallel along the same direction. Between the active layers 41 and 42, a current blocking region 43 is disposed. The first active layer 41 is for signal outputting, and the second active layer 42 is for temperature adjustment of the first active layer 41. This laser device 40 is referred to as the "laser device with a double active layer" hereinafter.

The laser device 40 with a double active layer further has a first electrode 45 for providing a current into the first active layer 41 and a second electrode 46 for providing a current into the second active layer 42. The first and second electrodes 45 and 46 are disposed on the top surface of the laser device 40 above the first and second active layers 41 and 42, respectively. The first electrode 45 is electrically connected to the output terminal for the normal phase data 141 of the laser driving circuit 14 through the wire 21. The junction portion between the first electrode 45 and the wire 21 is denoted by the reference numeral 51a. The second electrode 46 is electrically connected to the output terminal 142 for the reverse phase data of the laser driving circuit 14 through the wire 22. The junction portion between the second electrode 46 and the wire 22 is denoted by the reference numeral 52a.

As shown in FIG. 4, the laser device 40 has a light-transmitting front surface 52 and a light-reflective rear surface 54. The laser light generated in the first active layer 41 passes through the front surface 52 and propagates from the laser device 40. The propagating laser light 65 is focused by the lens 20 and guided to the outside of the laser module 80. The lens 20 does not guide the laser light generated in the second active layer 42 to the outside of the laser module 80. Therefore, only the light generated in the first active layer 41 is emitted from the laser module 80.

In order to cool the laser device 40, the temperature regulator 24, such as a Peltier element, may be disposed in the laser module 80. The temperature regulator 24 is placed so as to be thermally coupled to the laser device 40. The temperature regulator 24 is electrically connected to the temperature controller circuit 26. The temperature controller circuit 26 drives the temperature regulator 24 in accordance with the output of the thermistor 16. The temperature of the laser device 40 is adjusted in this way.

In order to monitor the output light of the laser device 40, the photodetector 28, such as a photodiode, may be disposed in the laser module 80. The photodetector 28 measures the power of the laser light generated in the first active layer 41. The photodetector 28 can be placed so as to face the rear surface 54 of the laser device 40. In this case, the photodetector 28 detects laser light leaking from the rear surface 54. The photodetector 28 is disposed so as to receive laser light 67 generated in the first active layer 41 but not receive laser light 68 generated in the second active layer 42. The photodetector 28 may be electrically connected to the LD driver 14. In this case, the LD driver 14 can adjust the magnitude of the operating current in accordance with the power of the output light of the first active layer 41 indicated by the output of the photodetector 28.

Similarly to the first embodiment, the variation of chirp when there is a series of identical bits is also reduced in the laser module 80 having the laser device 40 with the double active layer. This is because the first and second active layers 41 and 42 have complementary temperature changes.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A laser module for emitting laser signal light, comprising:
    first and second semiconductor laser devices placed adjacent to each other, said first laser device having a light-transmitting front surface and a light-receiving rear surface;
    a laser driving circuit having a first output terminal for a normal phase data and a second output terminal for a reverse phase data;
    a photodetector disposed to receive laser light leaking from the rear surface of said first laser device; and
    an optimal system for guiding laser light generated in said first semiconductor laser device to an outside of said laser module,
    wherein said first semiconductor laser device is connected to one of the first and second output terminals, and
    wherein said second semiconductor laser device is conected to the other of the first and second output terminals.

2. The laser module according to claim 1,
    wherein said first and second laser devices have substantially identical configurations.

3. The laser module according to claim 1,
    wherein said first and second laser devices are joined together in parallel to each other, side surfaces of said first and second laser devices being abutting to each other.

4. The laser module according to claim 1,
    wherein said optical system does not guide laser light generated in said second laser device to the outside of said laser module.

5. The laser module according to claim 1, further comprising:
    a temperature regulator thermally coupled to said first and second laser devices;
    a temperature measuring device thermally coupled to said first laser device; and
    a controller circuit connected to said temperature measuring device and said temperature regulator, said controller circuit driving said temperature regulator in accordance with an output of said temperature measuring device.

6. The laser module according to claim 1,
    wherein said photodetector is disposed not to receive laser light generated in said second laser device.

7. The laser module according to claim 1,
    wherein said second laser device has a light-transmitting front surface and a light-reflective rear surface, and
    wherein said photodetector is disposed not to receive laser light leaking from the rear surface of said second laser device.

* * * * *